United States Patent
Estevez Rodriguez

(10) Patent No.: US 11,821,072 B2
(45) Date of Patent: Nov. 21, 2023

(54) INSTALLATION WITH DISTRIBUTION MASK FOR VAPOR DEPOSITION OF A COATING ON OPTICAL ARTICLES ON A ROTARY SUPPORT

(71) Applicant: BNL EUROLENS, Bellegarde-sur-Valserine (FR)

(72) Inventor: Vicente Estevez Rodriguez, Montreal-la-Cluse (FR)

(73) Assignee: BNL EUROLENS, Bellegarde-sur-Valserine (FR)

( * ) Notice: Subject to any disclaimer, the term of this patent is extended or adjusted under 35 U.S.C. 154(b) by 143 days.

(21) Appl. No.: 16/347,957

(22) PCT Filed: Nov. 7, 2017

(86) PCT No.: PCT/EP2017/078471
§ 371 (c)(1),
(2) Date: May 7, 2019

(87) PCT Pub. No.: WO2018/087090
PCT Pub. Date: May 17, 2018

(65) Prior Publication Data
US 2019/0284679 A1    Sep. 19, 2019

(30) Foreign Application Priority Data
Nov. 10, 2016  (FR) ...................... 1660904

(51) Int. Cl.
*C23C 14/04*    (2006.01)
*C23C 14/50*    (2006.01)
(Continued)

(52) U.S. Cl.
CPC ............ *C23C 14/044* (2013.01); *B05B 12/22* (2018.02); *C23C 14/505* (2013.01);
(Continued)

(58) Field of Classification Search
CPC .................................................... C23C 14/044
See application file for complete search history.

(56) References Cited

U.S. PATENT DOCUMENTS

| 3,904,503 A * | 9/1975 | Hanfmann | ............... C23C 14/34 |
| | | | 427/523 |
| 4,380,212 A * | 4/1983 | Kraus | ................... C23C 14/044 |
| | | | 118/504 |

(Continued)

FOREIGN PATENT DOCUMENTS

| CN | 86205741 | 7/1987 |
| CN | 102227662 | 10/2011 |

(Continued)

OTHER PUBLICATIONS

International Search Report issued in International Patent Application No. PCT/EP2017/078471, dated Dec. 8, 2017 (English Translation).

(Continued)

*Primary Examiner* — Karl Kurple
(74) *Attorney, Agent, or Firm* — Norton Rose Fulbright US LLP

(57) ABSTRACT

The invention relates to an apparatus for the vapor deposition of a coating on optical articles, comprising a distribution mask (32) for controlling the vapor deposition of a coating on optical articles that is positioned in the path of some of the molecules emitted by said emitting source in the direction of the rotatable support for optical articles. The distribution mask (32) is fitted with at least one arm (34) positioned so as to mask at least one partial zone (16) of an individual housing (28) on a portion of the revolution turn, this masked partial zone (16) comprising the center of the individual housing (28).

17 Claims, 4 Drawing Sheets

Figure 1:
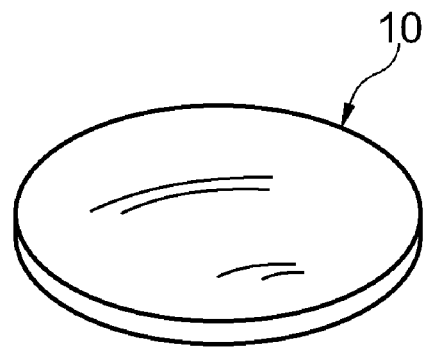

(51) Int. Cl.
*C23C 14/54* (2006.01)
*G02C 7/02* (2006.01)
*B05B 12/22* (2018.01)
*B05D 1/32* (2006.01)
*B05D 1/00* (2006.01)
*B05B 13/02* (2006.01)
*B25J 11/00* (2006.01)
*G03F 7/00* (2006.01)
*G02B 1/10* (2015.01)

(52) U.S. Cl.
CPC ............ *C23C 14/542* (2013.01); *G02C 7/024* (2013.01); *B05B 13/0228* (2013.01); *B05D 1/002* (2013.01); *B05D 1/32* (2013.01); *B25J 11/0075* (2013.01); *G02B 1/10* (2013.01); *G02C 7/02* (2013.01); *G03F 7/70733* (2013.01); *Y10S 438/943* (2013.01)

(56) References Cited

U.S. PATENT DOCUMENTS

| | | | | | |
|---|---|---|---|---|---|
| 4,449,478 | A | * | 5/1984 | Kraus | C23C 14/505 118/504 |
| 5,859,937 | A | * | 1/1999 | Nomura | G01N 21/7703 385/12 |
| 6,419,803 | B1 | * | 7/2002 | Baldwin | C23C 14/044 118/688 |
| 6,447,653 | B1 | | 9/2002 | Debley et al. | |
| 6,716,322 | B1 | * | 4/2004 | Hedge | C23C 14/044 118/504 |
| 7,062,348 | B1 | * | 6/2006 | Folta | C23C 14/044 204/192.11 |
| 7,311,939 | B2 | * | 12/2007 | Zultzke | C23C 14/044 118/720 |
| 8,398,776 | B2 | * | 3/2013 | Mitchell | B05B 13/0228 118/500 |
| 8,770,143 | B2 | * | 7/2014 | Endo | B05D 1/10 118/723 R |
| 10,421,092 | B2 | * | 9/2019 | Rouaud | B25J 15/0066 |
| 10,913,996 | B2 | * | 2/2021 | Moreni | C23C 14/505 118/504 |
| 2005/0016463 | A1 | * | 1/2005 | Hirano | C23C 14/28 118/726 |
| 2006/0130760 | A1 | * | 6/2006 | Zultzke | C23C 14/505 118/721 |
| 2009/0090301 | A1 | | 4/2009 | Tso et al. | |
| 2009/0186159 | A1 | * | 7/2009 | Mitchell | C23C 14/225 118/620 |
| 2009/0258151 | A1 | * | 10/2009 | Mitchell | B05B 13/0228 427/424 |
| 2010/0189929 | A1 | * | 7/2010 | Neal | C23C 14/30 427/585 |
| 2011/0315078 | A1 | * | 12/2011 | Liao | C23C 14/30 118/694 |
| 2013/0083327 | A1 | * | 4/2013 | Khalil | G01C 19/661 356/459 |
| 2013/0228121 | A1 | | 9/2013 | Pei | |
| 2016/0303607 | A1 | * | 10/2016 | Higuchi | B05D 1/002 |

FOREIGN PATENT DOCUMENTS

| | | |
|---|---|---|
| CN | 106048550 | 10/2016 |
| DE | 10234855 | 2/2004 |
| EP | 0928977 | 7/1999 |
| FR | 2775298 | 8/1999 |

OTHER PUBLICATIONS

First Office Action from the Chinese Patent Office issued in corresponding Chinese Patent Application No. 201780068146.1 dated Sep. 17, 2020.

* cited by examiner

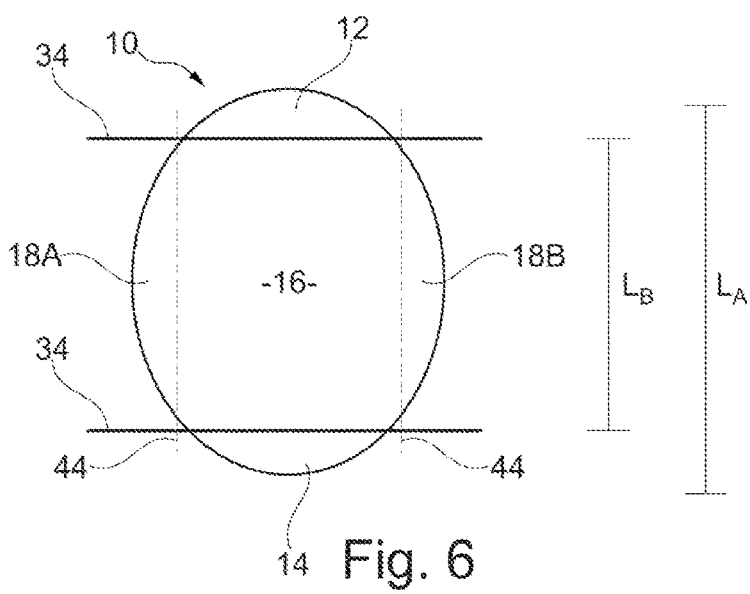

INSTALLATION WITH DISTRIBUTION MASK FOR VAPOR DEPOSITION OF A COATING ON OPTICAL ARTICLES ON A ROTARY SUPPORT

CROSS-REFERENCE TO RELATED APPLICATIONS

This application is a national phase application under 35 U.S.C. § 371 of International Application No. PCT/EP2017/078471 filed 7 Nov. 2017, which claims priority to French Patent Application No. 1660904 filed 10 Nov. 2016. The entire contents of each of the above-referenced disclosures is specifically incorporated by reference herein without disclaimer.

The present invention relates to an installation for vapor deposition of a coating on optical articles, and more specifically a distribution mask.

An optical article is understood to mean in particular an insert, a wafer, a semi-finished glass, a lens, corrective or not, which can be used as a spectacle glass, for example for spectacles, in particular sunglasses or masks or the like. This article is in particular produced in glass or in a plastic material. The optical article can be produced in one or more layers forming an assembly.

Generally, an optical article, such as an optical lens for example, is obtained from a complex manufacturing method which comprises, for example, the manufacturing of an insert or of a wafer, for example made of plastic material by an injection molding method.

Then, to give the insert (and therefore the final lens having to be arranged in front of the human eye for example) additional features, one or more surface treatments are for example applied.

These surface treatments can be an antiglare treatment and/or a hardening treatment, and/or a color-application treatment.

To do this, it is known practice to produce such a surface treatment by deposition of a coating formed by at least one layer of material by an evaporation-based method, and more specifically by evaporation in a vacuum.

For economic reasons and to save time, a large number of optical articles are treated at the same time, and the treatment chamber implemented to do this comprises, internally, a support which, mounted to rotate, has, distributed about its axis of rotation, a plurality of locations designed to each receive an optical article to be treated, and which, in practice, globally takes the form of a spherical cap or a dome.

Below this rotary dome there is arranged, on the axis of rotation, an emitting source, from which the material to be deposited is evaporated according to an evaporation cone.

In practice, this emitting source is for example composed of a support on which the material to be evaporated is arranged, for example a crucible or a plate, and, for its evaporation, the material is for example subjected to a heating by Joule effect, to electron bombardment, or to a cathode sputtering effect. The evaporation cone can be considered to be the envelope of the molecules sent toward the optical particles to be treated.

In all cases, one of the difficulties to be overcome lies in the fact that, for obvious reasons, in particular linked to the evaporation cone, it is important for the deposition or depositions made to be done uniformly on each of the optical articles independently of their location in the rotary dome and in particular independently of the distance from the axis of rotation of the dome in order for them all to be identical.

Now, the evaporation cone of a material is not in practice isotropic. In effect, the density of the material is generally greater at the center of the cone than on the lateral edges.

In effect, in transverse cross section, that is to say in a direction at right angles to the axis of rotation, the density of the molecules emitted is not uniform and the density is greater close to the axis of rotation and less great with distance away from the axis of rotation.

A first response to this problem is the cap form of the rotary support or dome.

However, this provision is not sufficient, and to further minimize this difference, which can in particular lead to unwanted disparities of characteristics, and, in particular, of tints, between the optical articles thus treated, it is known practice to interpose, between the emitting source and the rotary support bearing the different optical articles to be treated, an appropriately configured distribution mask.

That is the case, for example, in the documents FR2775298, U.S. Pat. Nos. 4,380,212 and 4,449,478 or even EPO 928 977, or even in the documents US 2013/228121, US 2009/090301 or U.S. Pat. No. 6,447,653.

Determined usually by trial and error, the configuration of the distribution mask thus implemented is such that the span of this distribution mask is for example greater in proximity to the axis of rotation of the rotary support than at a distance from this axis of rotation.

Thus, the deposition of a layer of material on the various optical articles treated can be done substantially according to the same thickness for all of them.

This makes it possible for the results to be globally satisfactory for optical articles having a small radius of curvature. However, deposition defects are observed for optical articles of greater curvature.

In effect, the center of the optical article is at a different distance from the source than the edge of the optical article. The distance from the center can be closer to or further away from the source than the edge depending on whether the coating is applied to a convex or respectively concave surface of the optical article.

The result thereof is a defect of uniformity of deposition and the thicknesses of the deposition performed for the surface treatment are therefore different on the edges of the optical articles, for example less great. This non-uniformity can reduce the duly manufactured antiglare performance levels introduce a variation of the distribution of a color which then no longer appears uniform, or introduce an iridization in the form of casts as alternate bands of color according to certain angles of incidence.

In effect, for a functional multilayer treatment such as, for example, an antiglare treatment or an interferential filter, the defects of nonuniformity of the different layers are cumulative and impact the performance of such a functional multilayer treatment, particularly on the edges.

The masks known from the state of the art do not make it possible to resolve this issue and primarily address only a variation of thickness from one optical glass to another, but not a defect of uniformity on one and the same optical article.

The aim of the invention is therefore to propose a distribution mask for controlling the vapor deposition of a coating on an optical article which makes it possible to better control the uniformity, at least over a band-form portion going from one peripheral edge to an opposite edge passing through the center, a surface treatment for an optical article having a significant curvature or sphericity, and in particular to make the surface treatments deposited on a multiplicity of optical articles uniform at lower cost.

To this end, the subject of the invention is an installation for vapor deposition of a coating on optical articles, comprising

- a source emitting molecules of a material to be deposited on the optical articles, the molecules being emitted according to an evaporation cone,
- a rotary support of optical articles comprising individual receptacles intended to receive the optical articles and performing revolutions during while the rotary support is rotating, and
- a distribution mask arranged on the path of a portion of the molecules emitted by said emitting source toward the rotary support of optical articles,
- wherein the distribution mask is formed with at least one arm arranged so as to mask a partial zone of an individual receptacle over a part of the revolution, this masked partial zone including the center of the individual receptacle.

By virtue of these properties, when the support is rotating by virtue of the interposed mask, peripheral portions of the optical articles installed in the receptacles remain exposed to the emitting source of material while the portion of the center is masked and cannot receive the molecules of the material to be deposited.

The distribution mask according to the invention can have one or more of the following features.

According to one aspect, individual receptacles of optical articles are arranged in concentric tracks and the at least one arm is arranged so as to be centered facing the concentric track.

The at least one arm is in particular curved, extending along an associated track.

The width of the arm at right angles to the associated track can be configured so that the projected print overlapping portion of the arm on the optical articles of the associated track has a width at right angles to the associated track which is less than the width of the optical articles when the latter are borne by the rotary support such that said arm prevents the deposition of molecules in a central portion of the optical articles and allows the deposition of molecules in two lateral portions of the optical articles arranged on either side relative to the associated track.

The width of the arm extends in a direction at right angles to the track and is in particular less than the width of the optical articles intended to be borne by the rotary support.

For example, provision is made for the mask to comprise an arm for each track of the rotary support.

The width at right angles to the associated track of the overlapping portion of the arm on the optical articles of the associated track for example lies between 60% and 95%, in particular between 80% and 90% and more particularly 85% of the width of the optical articles borne by the rotary support.

Each arm (34) for example has a rounded end.

In this case, the radius of curvature of the rounded ends corresponds for example to the radius of curvature of the optical article having to receive the coating.

The mask can comprise a central portion whose form is configured to compensate for a non-uniformity of the evaporation cone between the different tracks of receptacles of optical articles.

The installation can comprise, for each track of receptacles, a first arm and a second arm extending the central portion symmetrically on either side of the central portion.

The central portion can have an elliptical or trapezoidal form.

The length of the arms increases for example with the distance of the concentric associated tracks from the axis of rotation of the rotary support.

The length of the pairs of curved arms, taking into account a central portion if the latter is present, angularly masks a segment of a circle in particular between 60° and 160°, in particular between 80° and 140°.

The ends of the arms can define a form corresponding to the trace of the central portion.

The rotary support has in particular a concave form such that the receptacles of optical articles are arranged equidistant from the emitting source.

Figure 2:
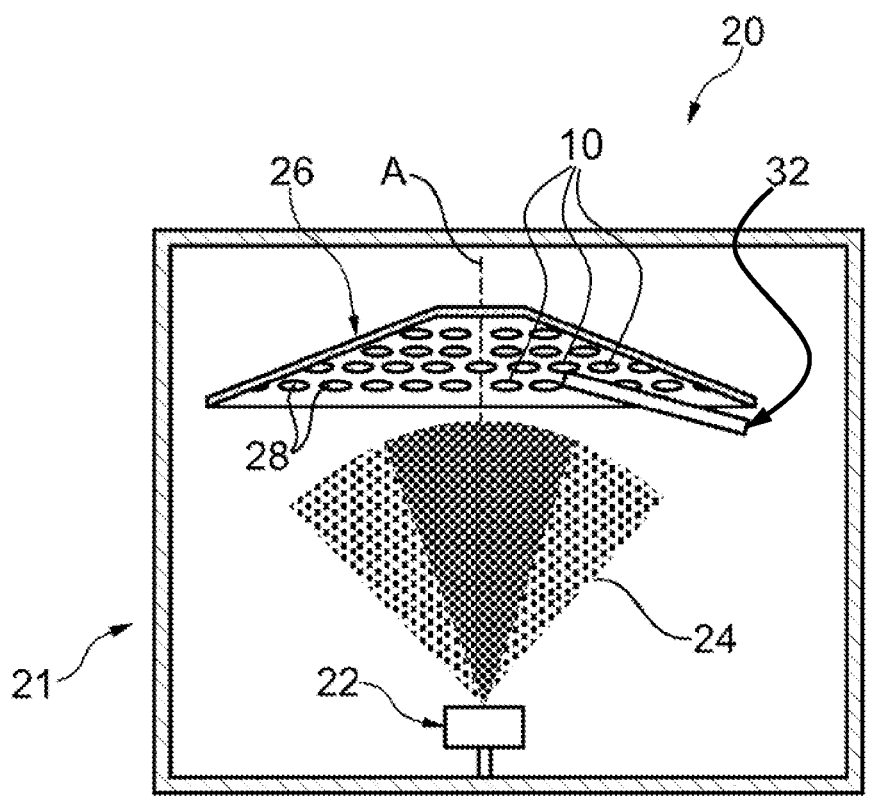
Figure 3:
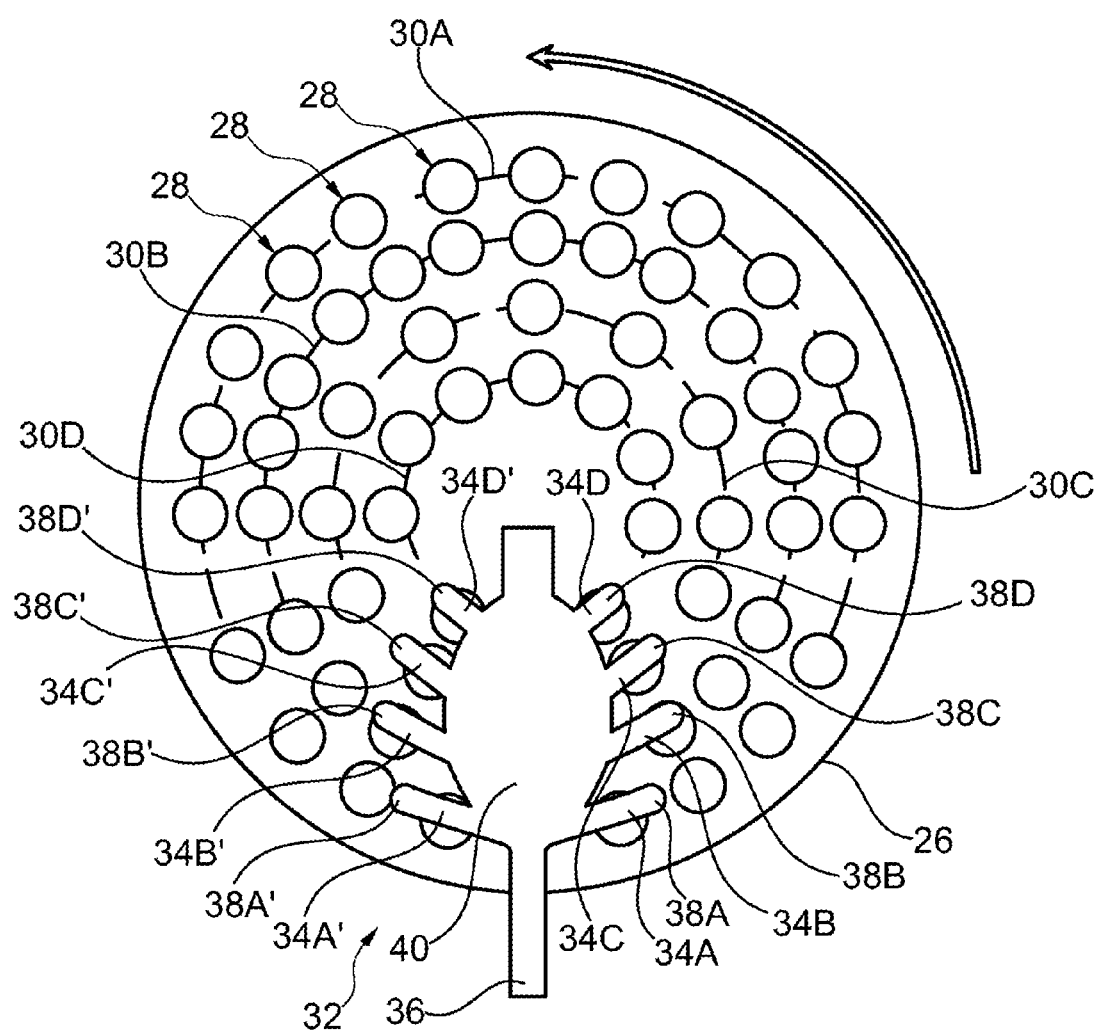
Figure 4:
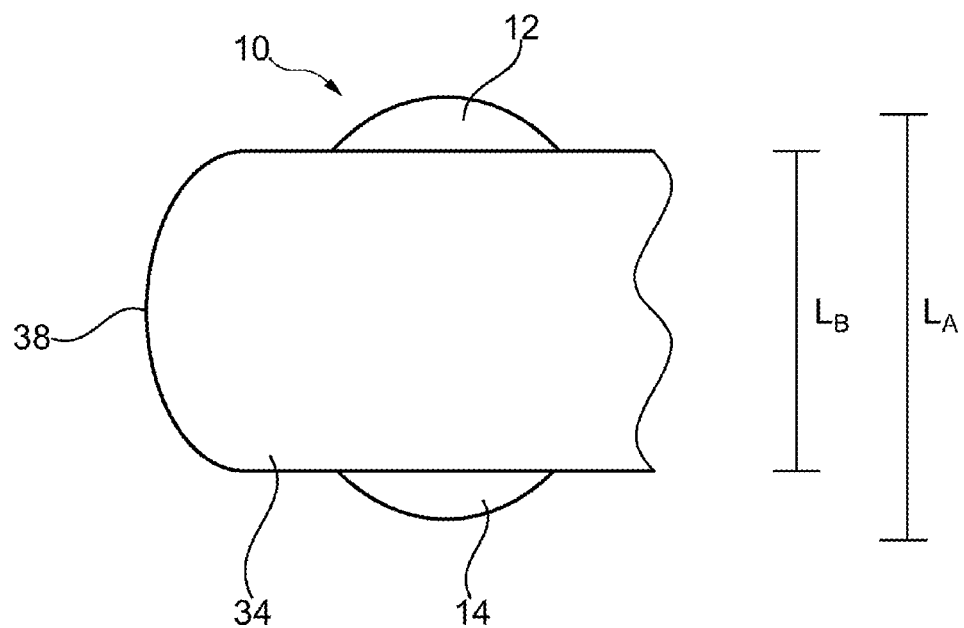
Figure 5:
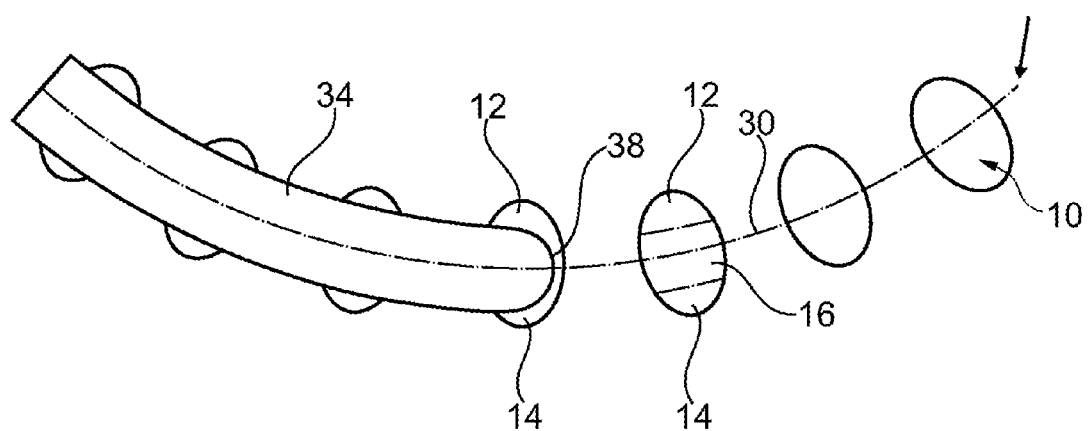

Other features and advantages of the invention will become more clearly apparent on reading the following description, given as an illustrative and nonlimiting example, and from the attached drawings in which:

FIG. 1 is a perspective view of an optical article to be treated,

FIG. 2 is a simplified side-view diagram, partially in transverse cross section, of a treatment chamber which is likely to be implemented for the treatment of optical articles, FIG. 3 is a schematic view from below of a rotary support of optical articles and of a distribution mask for controlling the deposition, FIG. 4 is a simplified diagram showing an optical article masked by a part of a mask, FIG. 5 is simplified diagram showing a plurality of optical articles with a portion of a mask, and FIG. 6 is diagram similar to that of FIG. 4 of an optical article having undergone a treatment.

In all the figures, the elements that are identical bear the same reference numbers. A reference in number form denotes an element in general or all the identical elements. When the reference number of the element is followed by a letter, with or without prime, a particular element is denoted which is distinct from an element having the same reference number but which is followed by a different letter with or without prime.

An example of an embodiment will now be described with reference to the figures.

The following embodiments are examples. Although the description refers to one or more embodiments, this does not necessarily mean that each reference relates to the same embodiment, or that the features apply only to a single embodiment. Simple features of different embodiments can also be combined or swapped to provide other embodiments.

FIG. 1 shows an optical article 10 to which some kind of treatment must be applied.

This optical article 10 can preferentially be an ophthalmic article, and in particular, an insert or outline puck, a wafer, a semi-finished glass, a lens, corrective or not, which can be used as a spectacle glass, for example for spectacles, in particular sunglasses or masks or the like. This article is in particular produced in mineral glass or in plastic material. The optical article 10 can be produced in one or more layers forming an assembly.

The treatment to be applied to the optical article 10 can be an antiglare treatment and/or a hardening treatment, and/or a color-application treatment.

FIG. 2 schematically shows an installation 20 for vapor deposition of a coating on a set of optical articles 10.

This installation 20 comprises a treatment chamber 21 and an emitting of source 22 molecules of a material to be deposited on the optical articles 10 according to an evaporation cone 24.

The treatment chamber 21 can be hermetically sealed and is linked to a vacuum unit (not represented), for example a vacuum pump, for lowering the pressure inside the treatment chamber 21 to a pressure suited to the treatment to be applied, typically, for example, of the order of $3.10^{-5}$ mbar.

The emitting source 22 is for example composed of a support on which the material to be evaporated is arranged, for example a crucible or a plate, and, for its evaporation, the material is for example subjected to a heating by Joule effect, to electron bombardment, or to a cathode sputtering effect.

The evaporation cone 24 is not uniform and has, in the center, a greater density of evaporated molecules than on the periphery which is indicated in FIG. 2 by a darker gray color for the evaporation cone 24 at the center compared to the periphery. Obviously, the density decreases in reality progressively from the center to the periphery.

Above the emitting source 22 there is arranged a rotary support 26 for the optical articles 10.

To this end, the rotary support 26 comprises individual receptacles 28 for the optical articles 10.

As can be better seen in FIG. 3 showing a view from below of the rotary support 26, the individual receptacles 28 are arranged, for example, on concentric tracks 30 embodied in FIG. 3 by dashed circles.

In the present example, the rotary support 26 comprises four concentric tracks individually referenced 30A, 30B, 30C and 30D with individual receptacles 28.

Obviously, more or fewer concentric tracks 30 can be provided according to the size of the installation 20 and in particular of the treatment chamber 21.

Moreover, on the rotary support 26, the concentric tracks are generally not marked. A track 30 is for example defined by the set of the individual receptacles 28 arranged at the same distance from the center of the rotary support 26.

It will be understood that during the rotation of the support 26, each of the individual receptacles 28 performs revolutions.

The rotary support 26 has, for example, a concave form, or, more specifically, in spherical cap form such that individual receptacles 28 of the optical articles 10 are arranged equidistant from the emitting source 22.

The rotary support 26 can rotate about an axis A which corresponds to the axis of symmetry of the rotary support and passes through the center thereof.

The installation 20 also comprises a distribution mask 32 for controlling the vapor deposition of a coating on optical articles 10. This mask 32 is arranged on the path of a portion of the molecules emitted by the emitting source 22 toward the rotary support 26 of the optical articles 10.

Since FIG. 3 can be likened to a view of the rotary support 26 from the source 22, it can be seen that the mask 32 is interposed for a portion of the molecules emitted by the source 22.

More specifically, the mask 32 comprises at least one arm 34, in the present case eight arms referenced individually 34A, 34A', 34B, 34B', 34C, 34C' and 34D, 34D'. In this particular embodiment, the arms have a generally curved form.

These curved arms 34 each extend along an associated track 30 and are arranged centered facing the latter.

Thus, the curved arms 34A, 34A' are associated with the track 30A, the curved arms 34B, 34B' are associated with the track 30B, the curved arms 34C, 34C' are associated with the track 30C and the curved arms 34D, 34D' are associated with the track 30D.

The mask 32 therefore comprises two curved arms 34 for each track 30 of the rotary support 26 which are arranged symmetrically relative to a radial holding axis 36 (see FIG. 3).

The radius of curvature of each arm 34 follows that of the associated track 30.

The width of each curved arm 34 at right angles to the associated track 30 is configured so that the overlapping portion of the curved arm 34 on the individual receptacles 28 and therefore on the optical articles 10 held in these individual receptacles 28 of the associated track 30 has a width at right angles to the associated track 30 which is less than the width of the optical articles 10 and of the individual receptacles 28 borne by the rotary support 26.

The overlapping portion can be likened to the shadow which would be cast on the rotary support 26 by the mask 32 if the emitting source 22 were a light source. It is easily understood that, if the mask 32 were brought close to the emitting source 22, because of the emitting cone 24, it would be necessary to reduce the size of the mask 32 to obtain the same effects.

To be as accurate as possible in the deposition of the coatings, every effort is made to place the mask 32 as close as possible to the rotary support 26, typically at ten or so cm.

This can clearly be seen in FIG. 3, but is illustrated in more detail in FIGS. 4 and 5.

In effect, FIGS. 4 and 5 schematically show a view of the curved arm 34 from the emitting source 22.

Whereas FIG. 3 shows the individual receptacles 28, and in FIGS. 4 and 5 an optical article 10 is represented. The outline of the optical article 10 of FIGS. 4 and 5 is substantially the same as the outline of each individual receptacle 28 so as to be able to hold these optical articles 10. Thus, FIGS. 4 and 5 can also be interpreted relative to the individual receptacles 28 of the optical articles 10.

When, by the rotation of a rotary support 26, the optical article 10 in its individual receptacle 28 passes behind a curved arm 34 of the mask 32, only lateral portions or edges 12 and 14 are exposed to the molecules emitted by the emitting source 22.

Thus, the curved arm or arms 34 prevent the deposition of molecules in a partial zone 16 including the center of the individual receptacle 28. This partial zone 16 corresponds in the present case to a central portion (see FIG. 5) of the optical articles 10 and allow the deposition of molecules in the two lateral portions 12 and 14 of the optical articles 10, these lateral portions 12 and 14 being arranged on either side relative to the associated track 30. In effect, the center of the optical article 10 is at a different distance from the emitting source 22 compared to the edge of the optical article 10. In the case of an optical article 10 having a significant curvature or sphericity, the center of the optical article 10 is closer to the emitting source 22 than the peripheral edges. Thus, over one revolution, the optical article 10 would receive more molecules deposited in its central part than on the peripheral edges. This is therefore corrected by the curved arm or arms 34 because, when the optical article 10 is masked by the curved arm or arms 34, the center does not receive molecules whereas the peripheral edges do still receive them. Thus, over one revolution, when there is no mask in front of the optical article 10, molecules are deposited over all of the optical article 10, but with a greater density at the center thereof, the partial zone 16 including the center of the individual receptacle 28 (closer to the emitting source 22), than the lateral portions 12 and 14. When the optical article 10 is masked by the curved arm or arms 34, molecules are deposited only on the lateral parts 12 and 14 and therefore fill the deficit of molecules deposited relative to the partial zone 16 including the center of the optical article 10.

The presence of this arm or these arms 34 makes it possible to overcome the difference in distance between the center and the edges of the optical article 10 leading to a gradient of density of deposited molecules and thus making it possible to ensure a better uniformity of the deposition of the coating over all of the optical article 10 having a significant curvature or sphericity.

It is therefore understood that the distribution mask 32 is formed with at least one arm 34 arranged so as to mask a partial zone 16 of an individual receptacle 28 over a part of the revolution, this masked partial zone 16 including the center of the individual receptacle 28.

The width $L_B$ of the curved arms 34 in a direction at right angles to the track 30 is less than the width $L_A$ of the optical articles 10 intended to be borne by the rotary support 26. The width $L_A$ of the optical articles is measured radially relative to the center of the rotary support 26.

More specifically, the width $L_B$ at right angles to the associated track 30 of the overlapping portion of the curved arm 34 on the optical articles of the associated track 30 lies between 60% and 95%, in particular between 80% and 90% and more particularly approximately 85% of the width $L_A$ of the optical articles borne by the rotary support.

The length of the pairs of curved arms 34, taking into account a central part of the mask, angularly covers a segment of a circle of between 60° and 160°, in particular between 80 and 140°. Thus, upon a rotation of the mobile support 26, taking into account a central width of the mask, the central part 16 of the optical article 10 is only exposed to the molecules emitted by the emitting source 22 over an angular travel of between 200° and 300°, in particular between 220° and 280°. The result thereof is also that the length of the curved arms 34 increases with the distance of the associated concentric tracks 30 from the axis of rotation A of the rotary support 26.

In this same configuration, the lateral portions 12 and 16 of the optical article 10 are exposed to the molecules emitted by the emitting source 22 over an angular travel greater than between 250° and 350°, for example between 280° and 350°, for example approximately 340°.

According to an embodiment that is not represented, the mask 32 can comprise a single arm 34 per track 30 or two arms per track 30. The aggregate length of the arm or arms 34 of a track 30 is advantageously chosen as a function of a difference in height between the edge and the center of an optical article 10 designed to be placed in one of the individual receptacles 28. In particular, said length can be chosen so as to cover, for a track 30, a segment of a circle chosen as a function of said height. In particular, said height can be a mean or median height of the optical articles 10 intended to be treated in said installation 20.

More specifically, said length can be chosen as a function of the impact of the difference in height on the difference in density of flow of material to be deposited arriving respectively at the edge and at the center of the optical article 10.

To make the deposition even more uniform, the ends 38 (38A, 38A', 38B, 38B', 38C, 38C' and 38D, 38D') of the curved arms 34 have a rounded form, in which the radius of curvature of the rounded ends corresponds to the radius of curvature of the optical article 10 having to receive the coating.

Whereas the curved arms 34 make it possible to make the deposition on the surface of the optical articles 10 more uniform because of the curvature or convexity of these articles 10, the mask 32 also comprises a central portion 40 of general form, here ellipsoid, configured to compensate for a non-uniformity of the evaporation cone 24 between the different tracks 30 of receptacles 28 of optical articles 10.

Alternatively, this central portion can be omitted, or be in the form of a triangle, a rhombus, a trapezium or any other appropriate form.

This central portion 40 is fixed centrally on the radial holding axis 36.

As can be seen in FIG. 3, the mask 32 therefore comprises the central part 40 and, for each track 30A, 30B, 30C and 30D of receptacles, a first curved arm 34A, 34B, 34C and 34D and a second curved arm 34A', 34B', 34C' and 34D' extending the central portion 40 symmetrically relative to the major ellipse axis arranged radially relative to the axis of rotation A of the rotary support 26.

According to a variant that is not represented, it is also possible to use two distinct distribution masks, a first distribution mask with the curved arms to compensate for the curvature of the optical articles 10 and a second distribution mask of a form gauged to compensate for the non-uniformity of the cone of emission 24, arranged for example in another segment of the rotary support 26, in particular opposite.

Finally, in one embodiment, the rounded ends 38 of the curved arms 34 describe a semi-ellipsoid form corresponding to the trace of the central portion 40 of ellipsoid form. That is to say, if the ends 38A, 38B, 38C and 38D were to be linked by an imaginary curve, a semi-ellipsoid form would be obtained which is substantially identical to the ellipsoid form of the central portion 40 on the same side of the holding axis 36 but just offset angularly. Likewise, if the ends 38A', 38B', 38C' and 38D' were linked by an imaginary curve, a semi-ellipsoid form would be obtained which is substantially identical to the ellipsoid form of the central portion 40 on the same side of the holding axis 36 but just offset angularly.

Such a semi-ellipsoid form is designed to compensate for a radial variation in the rate of deposition of material on the rotary support 26, possibly due to a difference in the form of the rotary support 26 compared to a portion of a sphere centered on the emitting source 22 or potentially due to a radial non-uniformity of distribution of the material emitted by said emitting source.

In another embodiment, the rounded ends 38 of the curved arms 34 describe such a semi-ellipsoid form but without however the central portion 40 having an ellipsoid form.

FIG. 6 shows a diagram similar to FIG. 4 of an optical article 10 on which a coating has been applied as explained above. It is therefore understood also that the coating was able to be made uniform in the lateral portions 12 and 4 and central portion 16.

However, in the portions 18A and 18B, the uniformity of the coating applied is less good than for the portions 12 and 14 relative to the central portion 16.

Based on the desired requirements, it is possible to cut the optical article 10 along the dashed lines 44 to obtain, for example, a lens or an optical glass of generally rectangular form.

Thus, the installation according to the invention makes it possible to very uniformly deposit coatings on an optical article 10, at least along a band at right angles to the position of the article 10 in the rotary support 26 by virtue of the mask 32 with curved arms 34 in order to compensate in particular for the difference in distribution of the coating which is due to the curvature/sphericity of the optical article 10.

The invention claimed is:

1. An installation for vapor deposition of a coating on optical articles, comprising:
a source emitting molecules of a material to be deposited on the optical articles, the molecules being emitted from an evaporation cone;
a rotary support which is concave shaped, said rotary support comprising individual receptacles, each individual receptacle configured to receive one optical article of the optical articles and undergoes revolutions while the rotary support is rotating while in operation, the individual receptacles of the optical articles are arranged in concentric tracks of the rotary support;
a distribution mask arranged in a path of a portion of the molecules emitted by said source emitting molecules toward the rotary support while in operation;
wherein the distribution mask is formed with a central portion having two curved sides, a front portion including two straight sides extending from a front of the central portion, a rear portion including a radial holding axis, and at least one arm on each curved side of the central portion, wherein, each arm arranged so as to mask only a partial zone of an individual receptacle over a part of a revolution of the individual receptacle, and the at least one arm on each curved side of the central portion of the distribution mask is arranged to extend along an associated track of the rotary support and the at least one arm on each curved side of the central portion are arranged symmetrically relative to the radial holding axis of the distribution mask, the partial zone which is masked including the center of the individual receptacle while lateral portions of an optical article in the receptacle are exposed to the molecules emitted by the source;
wherein the optical articles have a curvature or sphericity such that a center of the one optical article of the optical articles is closer to the source than peripheral edges of the one optical article of the optical articles.

2. The installation of claim 1, wherein the individual receptacles of the optical articles are arranged in the concentric tracks of the rotary support and the at least one arm on each curved side of the distribution mask are arranged so as to be centered facing the concentric tracks.

3. The installation of claim 1, wherein the at least one arm on each curved side of the distribution mask is curved, extending along an associated concentric track.

4. The installation of claim 3, wherein the width of the at least one arm on each curved side of the distribution mask at right angles to the associated concentric track is configured so that the overlapping portion of the at least one arm on the optical articles of the associated track has a width at right angles to the associated concentric track which is less than the width of the optical articles when the latter are borne by the rotary support such that, during use, said at least one arm on each curved side of the distribution mask prevents the deposition of molecules in a central portion of the optical articles and allows the deposition of molecules in two lateral portions of the optical articles arranged on either side relative to the associated concentric track.

5. The installation of claim 4, wherein the width (LB) of the at least one arm on each curved side of the distribution mask extends in a direction at right angles to the associated concentric track and is less than the width (LA) of the optical articles borne by the rotary support.

6. The installation of claim 4, wherein the width (LB) at right angles to the associated concentric track of the overlapping portion of the at least one arm on each curved side of the distribution mask on the optical articles of the associated concentric track lies between 60% and 95% of the width of the optical articles borne by the rotary support.

7. The installation of claim 6, wherein the width (LB) at right angles to the associated concentric track of the overlapping portion of the at least one arm on each curved side of the distribution mask on the optical articles of the associated concentric track lies between 80% and 90% of the width of the optical articles borne by the rotary support.

8. The installation of claim 7, wherein the width ($L_B$) at right angles to the associated concentric track of the overlapping portion print of the arm on the optical articles of the associated concentric track is 85% of the width of the optical articles borne by the rotary support.

9. The installation of claim 3, wherein the at least one arm on each curved side of the distribution mask has a rounded end.

10. The installation of claim 9, wherein the radius of curvature of the rounded end corresponds to the radius of curvature of the one optical article.

11. The installation of claim 3, wherein the central portion of the distribution mask has a form configured to compensate for a non-uniformity of the evaporation cone between the different tracks of receptacles of the optical articles.

12. The installation of claim 11, wherein the central portion of the distribution mask has an elliptical form.

13. The installation of claim 2, wherein the length of the at least one arm on each curved side of the distribution mask increases with the distance of the associated concentric tracks from the axis of rotation (A) of the rotary support.

14. The installation of claim 11, wherein the length of pairs of curved arms, together with the central portion of the distribution mask, angularly masks a segment of a circle of between 60° and 160°.

15. The installation of claim 14, wherein the length of the pairs of curved arms, together with the central portion of the distribution mask, angularly masks a segment of a circle between 80° and 140°.

16. The installation of claim 9, wherein the distribution mask includes a plurality of at least one arm on each curved side of the distribution mask wherein the rounded ends of the plurality of at least one arm on each curved side of the distribution mask define a form corresponding to a trace of the central portion of the distribution mask.

17. The installation of claim 1, wherein the rotary support has a concave form such that the receptacles of the optical articles are arranged equidistant from the source.

* * * * *